United States Patent
Hattori

(10) Patent No.: US 7,429,896 B2
(45) Date of Patent: Sep. 30, 2008

(54) FREQUENCY STABILITY MEASURING APPARATUS

(75) Inventor: Masashi Hattori, Sagamihara (JP)

(73) Assignee: Epson Toyocom Corporation (JP)

( * ) Notice: Subject to any disclaimer, the term of this patent is extended or adjusted under 35 U.S.C. 154(b) by 31 days.

(21) Appl. No.: 11/466,566

(22) Filed: Aug. 23, 2006

(65) Prior Publication Data

US 2007/0054649 A1    Mar. 8, 2007

(30) Foreign Application Priority Data

Aug. 24, 2005   (JP) .............................. 2005-243483

(51) Int. Cl.
*G01R 23/14* (2006.01)

(52) U.S. Cl. ................. 331/44; 331/74; 324/76.41; 324/76.44

(58) Field of Classification Search .................. 331/44, 331/46, 47, 56, 74; 324/76.19, 76.23, 76.39, 324/76.41, 76.44, 76.45, 76.47, 76.48
See application file for complete search history.

(56) References Cited

U.S. PATENT DOCUMENTS 3,838,338 A *  9/1974  Khoury ................... 324/76.47
4,063,169 A * 12/1977  Palmer ..................... 324/76.56
4,651,089 A *  3/1987  Haigh ...................... 324/76.42

FOREIGN PATENT DOCUMENTS

| JP | 62-110166 | 5/1987 |
|---|---|---|
| JP | 2001-045595 | 2/2001 |
| JP | 2002-243778 | 8/2002 |

* cited by examiner

*Primary Examiner*—Robert J. Pascal
*Assistant Examiner*—Ryan J Johnson
(74) *Attorney, Agent, or Firm*—Harness, Dickey & Pierce, P.L.C.

(57) ABSTRACT

A frequency stability measuring apparatus for measuring a frequency fluctuation of a signal outputted from a given signal source includes: a reference signal output unit that outputs a reference frequency signal; a mixer that mixes a signal outputted from the signal source with the reference frequency signal outputted from the reference signal output unit and outputs a resultant signal; a filter that allows a low-frequency component of the signal outputted from the mixer to pass therethrough; a waveform-shaping circuit that shapes a waveform of a signal outputted from the filter; a counter that counts a number of pulses of a signal shaped by the waveform-shaping circuit; and a control unit that calculates average frequencies of the signal outputted from the filter within respective measurement periods of a predetermined length, and calculates and outputs a standard deviation of the average frequencies calculated

2 Claims, 5 Drawing Sheets

FREQUENCY STABILITY MEASURING APPARATUS

BACKGROUND

1. Technical Field

The present invention relates to a frequency stability measuring apparatus and more specifically to a structure of a frequency stability measuring apparatus that measures a frequency stability of an oscillator under test with a high resolution.

2. Related Art

A method of measuring a phase noise in order to test the frequency stability of a signal source such as an oscillator has already been known. Quadrature detection is commonly used as a method for measuring the phase noise of an oscillator that requires high frequency stability, such as an oscillator used in a communication device or the like. In the quadrature detection, an output of an oscillator under test and an output of a reference oscillator (a voltage controlled oscillator) with less noise than that of the oscillator under test are supplied to a mixer. At this time, a control voltage of a PLL circuit is controlled so that a phase difference between the oscillator under test and the reference oscillator is adjusted to 90 degrees. Then, the sum of a noise component of the oscillator under test and that of the reference oscillator is supplied via a low-pass filter (LPF) to an FFT analyzer to measure the phase noise of the oscillator under test. Thereafter, an analysis by the FFT analyzer, i.e., a phase noise characteristic of the oscillator under test, is displayed on a display screen of a personal computer (PC).

The quadrature detection, however, has a problem in that it takes a long time before starting measurement because it is necessary to adjust the reference oscillator so that the phase difference between the oscillator under test and the reference oscillator will be 90 degrees. Moreover, because it requires use of the FFT analyzer, a spectrum analyzer, or the like, which are costly, the quadrature detection is not suitable as a method for measuring all oscillators mass-produced.

FIG. 5 is a block diagram of a frequency stability testing apparatus disclosed in JP-A-2002-243778, which has addressed such a problem of the known quadrature detection. This frequency stability testing apparatus 21 includes an oscillator 22 under test, a plurality of oscillators 23 having different oscillation frequencies, a power supply 24 for driving these oscillators 22 and 23, a switching circuit 25, a mixer 26, a filter 27, a counter 28, and a microcomputer 29. It is suggested that this exemplary related art provides an apparatus and method for testing the frequency stability that are capable of testing the frequency stability of a signal source, such as an oscillator, easily and in a short time.

JP-A-2002-243778 is an example of related art.

This exemplary related art measures a difference frequency between the two oscillators by inputting, to the counter, a signal obtained by passing an output of the mixer through the filter. Measuring this signal in a rapid manner requires use of a reciprocal counter, but it is known that the reciprocal counter causes increase of measurement error depending on a slew rate of an input signal. The technique of the exemplary related art decreases the slew rate to an extreme extent because of the filter, and therefore this technique has a problem in that it is difficult to achieve faster and more precise measurement.

Moreover, in the case where a counter gate time is set to about 10 ms, a frequency resolution of about 0.1 mHz is required to measure the stability of a crystal oscillator with a sufficient resolution. However, general reciprocal counters achieve a resolution of about 10 mHz only (see FIG. 4). Therefore, in the case of measuring objects with high stability such as crystal oscillators, there are problems of an insufficient resolution, a long measurement time, etc.

SUMMARY

An advantage of the invention is to provide a frequency stability measuring apparatus in which a waveform-shaping circuit is inserted between a filter and a counter to increase the slew rate of a signal inputted to a counter and thus to increase a frequency resolution to enhance the stability of measurement.

According to one aspect of the invention, a frequency stability measuring apparatus for measuring a frequency fluctuation of a signal outputted from a given signal source includes: a reference signal output unit that outputs a reference frequency signal; a mixer that mixes a signal outputted from the signal source with the reference frequency signal outputted from the reference signal output unit and outputs a resultant signal; a filter that allows a low-frequency component of the signal outputted from the mixer to pass therethrough; a waveform-shaping circuit that shapes a waveform of a signal outputted from the filter; a counter that counts a number of pulses of a signal shaped by the waveform-shaping circuit; and a control unit that calculates average frequencies of the signal outputted from the filter within respective measurement periods of a predetermined length, and calculates and outputs a standard deviation of the average frequencies calculated.

A feature of this aspect of the invention lies in that a signal whose slew rate has been reduced because of the filter is wave-shaped by the waveform-shaping circuit to increase the slew rate, and the resultant waveform is subjected to counting to increase a frequency resolution. Then, the average frequencies are calculated based on the number of pulses counted by the counter and the standard deviation of the calculated average frequencies is calculated to determine a passing or failing of a test.

According to this aspect, because the waveform shaped by the waveform-shaping circuit is subjected to counting to increase the frequency resolution, and the average frequencies are calculated based on the number of pulses counted by the counter and the standard deviation of the calculated average frequencies is calculated to determine a passing or failing of a test, measurement with a high resolution can be achieved and the measurement time can be shortened.

It is preferable that the waveform-shaping circuit include an amplifier that amplifies a waveform of the signal outputted from the filter, and an amplitude limiter circuit that limits an amplitude of a signal outputted from the amplifier, and that a slew rate of the signal inputted to the counter in a predetermined gate time be set close to a saturation point of a frequency resolution of the counter.

The relationship between the slew rate of an input signal and the frequency resolution is such that the resolution improves in proportion to the slew rate. However, the resolution does not improve infinitely but becomes saturated at a certain slew rate. Thus, even if the slew rate is made higher, the resolution does not change. Therefore, setting the slew rate close to the saturation point of the resolution is the most efficient.

In this case, since the slew rate of the signal inputted to the counter in the predetermined gate time may be set close to the saturation point of the frequency resolution of the counter, the setting of an unnecessary slew rate can be avoided and the setting of an efficient slew rate can be achieved.

Also, it is preferable that the filter be formed by a low-pass filter or a band-pass filter.

The signal outputted from the mixer contains an unnecessary harmonic component. If this harmonic were inputted to the waveform-shaping circuit, a waveform thereof would be inputted as noise to the counter, making accurate counting impossible. Therefore, in order to remove the harmonic, a low-pass filter or a band-pass filter may be used.

In this case, since the filter may be formed by a low-pass filter or a band-pass filter, the unnecessary harmonic can be removed to accomplish the counting of a signal with reduced noise.

Also, it is preferable that the slew rate of the waveform-shaping circuit be set in the range of 0.1 V/µs to 100 V/µs.

In order to measure the stability of a crystal oscillator with a sufficient resolution, if a counter gate time is set to approximately 10 ms, a frequency resolution of approximately 0.1 mHz is required. However, general counters achieve only a resolution of approximately 10 mHz. The slew rate corresponding to 10 mHz is 0.1 V/µs, and the slew rate corresponding to 0.1 mHz is 100 V/µs. Therefore, if the slew rate is set in this range, the waveform-shaping circuit can deal with most resolutions.

In this case, since the slew rate of the waveform-shaping circuit may be set in the range of 0.1 V/µs to 100 V/µs, the slew rate can be selected in accordance with the accuracy of an oscillator.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Hereinafter, one embodiment of the invention will be described in detail with reference to the drawings. However, it should be understood that structural components and types, combination, shapes and relative arrangement thereof, etc., as described below with respect to this embodiment are, unless otherwise specifically stated, illustrative and not restrictive of the scope of the invention.

Figure 1:
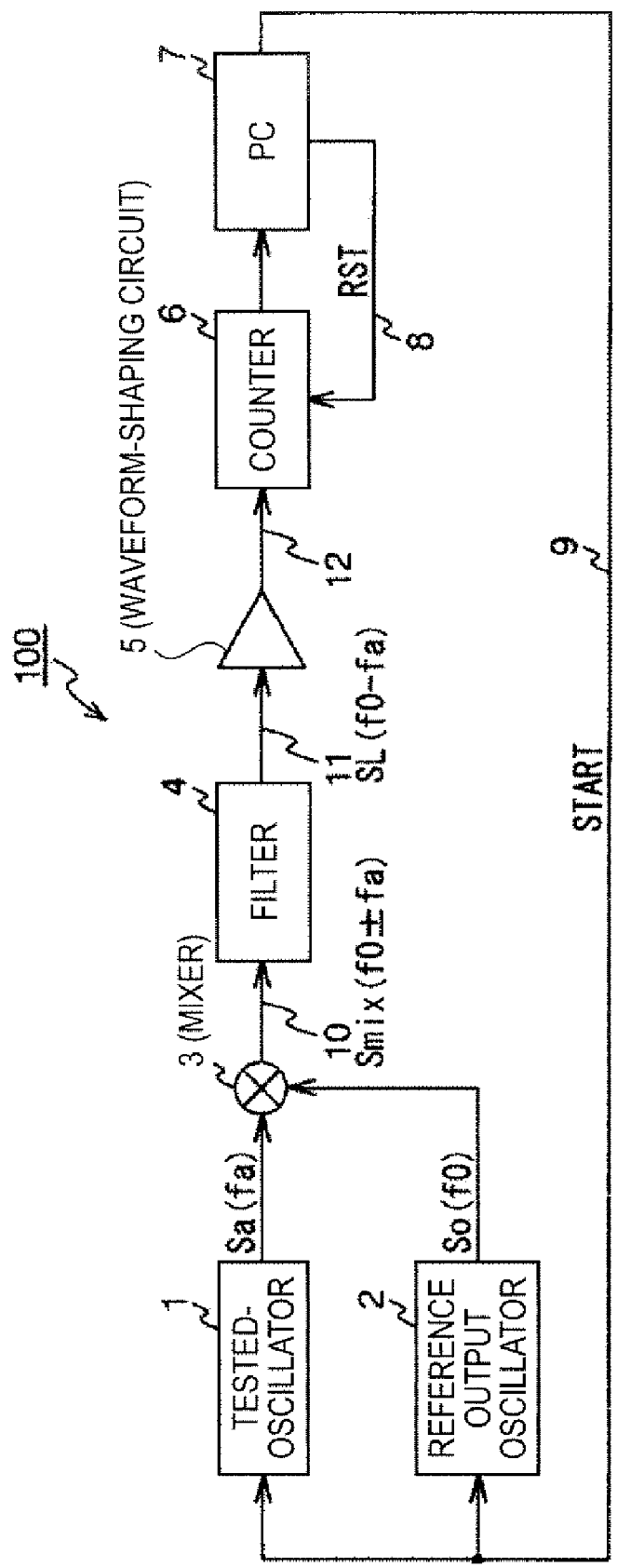
FIG. 1 is a block diagram of a frequency stability measuring apparatus according to one embodiment of the invention.

FIG. 1 is a block diagram of a frequency stability measuring apparatus 100 according to the embodiment of the invention. The frequency stability measuring apparatus 100 includes: a tested oscillator (a signal source) 1, which is to be subjected to measurement; a reference output oscillator (a reference signal output unit) 2 that outputs a reference frequency signal; a mixer 3 that mixes a signal outputted from the tested oscillator 1 with the reference frequency signal outputted from the reference output oscillator 2 and outputs a resultant signal; a filter 4 that allows a low-frequency component of the signal outputted from the mixer 3 to pass therethrough; a waveform-shaping circuit 5 that shapes a waveform of a signal outputted from the filter 4; a counter 6 that counts the number of pulses of the signal subjected to waveform shaping at the waveform-shaping circuit 5; and a personal computer (hereinafter referred to as a "PC") (a control unit) 7 that calculates average frequencies of the signal outputted from the filter 4 within respective measurement periods of a predetermined length and calculates and outputs a standard deviation of the calculated average frequencies.

Here, because the frequency stability measuring apparatus 100 has as its purpose to determine frequency stability of a plurality of types of oscillators, the tested oscillator 1 is not restricted to one particular type of oscillator. For example, the tested oscillator 1 may be any of a low-frequency oscillator, a mid-frequency oscillator, and a high-frequency oscillator.

The reference output oscillator 2 is a reference oscillator with high frequency stability and preferably outputs a signal So that allows a frequency difference between the signal So and the signal from the oscillator 1 tested by the frequency stability measuring apparatus 100 to be on the order of kHz.

The filter 4 allows only the low-frequency component of a signal Smix outputted from the mixer 3 to pass therethrough, thereby outputting a signal SL with a frequency of f0−fa while cutting a frequency of f0+fa. The signal outputted from the mixer 3 contains an unnecessary harmonic component. If this harmonic were inputted to the waveform-shaping circuit 5, a waveform thereof would be inputted as noise to the counter, making accurate counting impossible. Therefore, to remove the harmonic, this embodiment of the invention uses a low-pass filter or a band-pass filter.

Figure 2A:
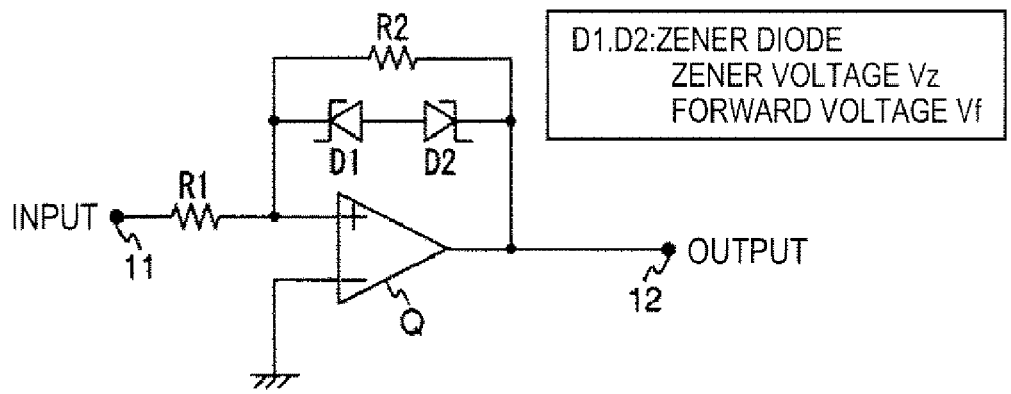
FIG. 2A is a diagram illustrating an exemplary configuration of a waveform shaping circuit 5 according to the embodiment of the invention.
Figure 2B:
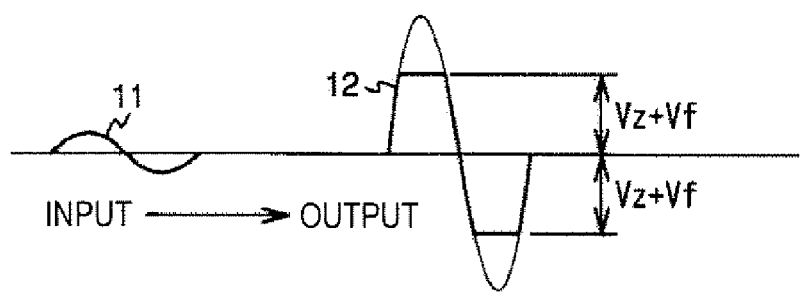
FIG. 2B is a diagram illustrating an input waveform and an output waveform.

As illustrated in FIG. 2A, the waveform-shaping circuit 5 includes a resistance R1 and an operational amplifier Q which are inserted in series between an input 11 and an output 12, and a resistance R2 and Zener diodes D1 and D2 which are connected to an output and a positive input of the operational amplifier Q. In the circuit of FIG. 2A, a voltage amplification Av is given by Av=R1/R2, and the voltage amplification Av is determined so that a slew rate (hereinafter referred to as a "SR") of an output will have a desired value. In addition, the amplitude of the output is regulated by the Zener diodes D1 and D2. Specifically, if a Zener voltage is Vz and a forward voltage is Vf, the amplitude thereof becomes Vz+Vf on both positive and negative sides, as illustrated in FIG. 2B. Therefore, an output amplitude Vout is given by Vout=2(Vz+Vf). The counter 6 counts and outputs the number of pulses of the signal 12 and, in addition, resets a count value based on a reset signal (RST) 8 outputted from the PC 7, It is preferable that as this counter 6, a type of counter, such as a so-called double counter, that is capable of continuous counting without a dead time regardless of the reset operation be used.

The PC 7 controls the entire frequency stability measuring apparatus 100 to automatically measure the frequency accuracy of the tested oscillator 1. In addition, the PC 7 calculates, based on the count values sent from the counter 6, average frequencies of the signal SL within respective average measurement times τ of a predetermined length, calculates a standard deviation σy(τ) of the average frequencies based on differences between neighboring average frequencies, and displays a determination result based on the calculation on a display screen (not shown). Moreover, the PC 7 outputs a control signal (START) 9 to give an instruction to start and stop measurement when measuring the frequency accuracy of the oscillator 1.

A feature of the embodiment of the invention is that the waveform-shaping circuit 5 is used to wave-shape the signal whose slew rate has been reduced because of the filter 4 to increase the slew rate, and the resultant waveform is subjected to counting to provide an increased frequency resolution. In addition, the average frequencies are calculated based on the number of pulses counted by the counter 6, and the standard deviation of the average frequencies is calculated to give a pass/fail result of a test.

Figure 3:
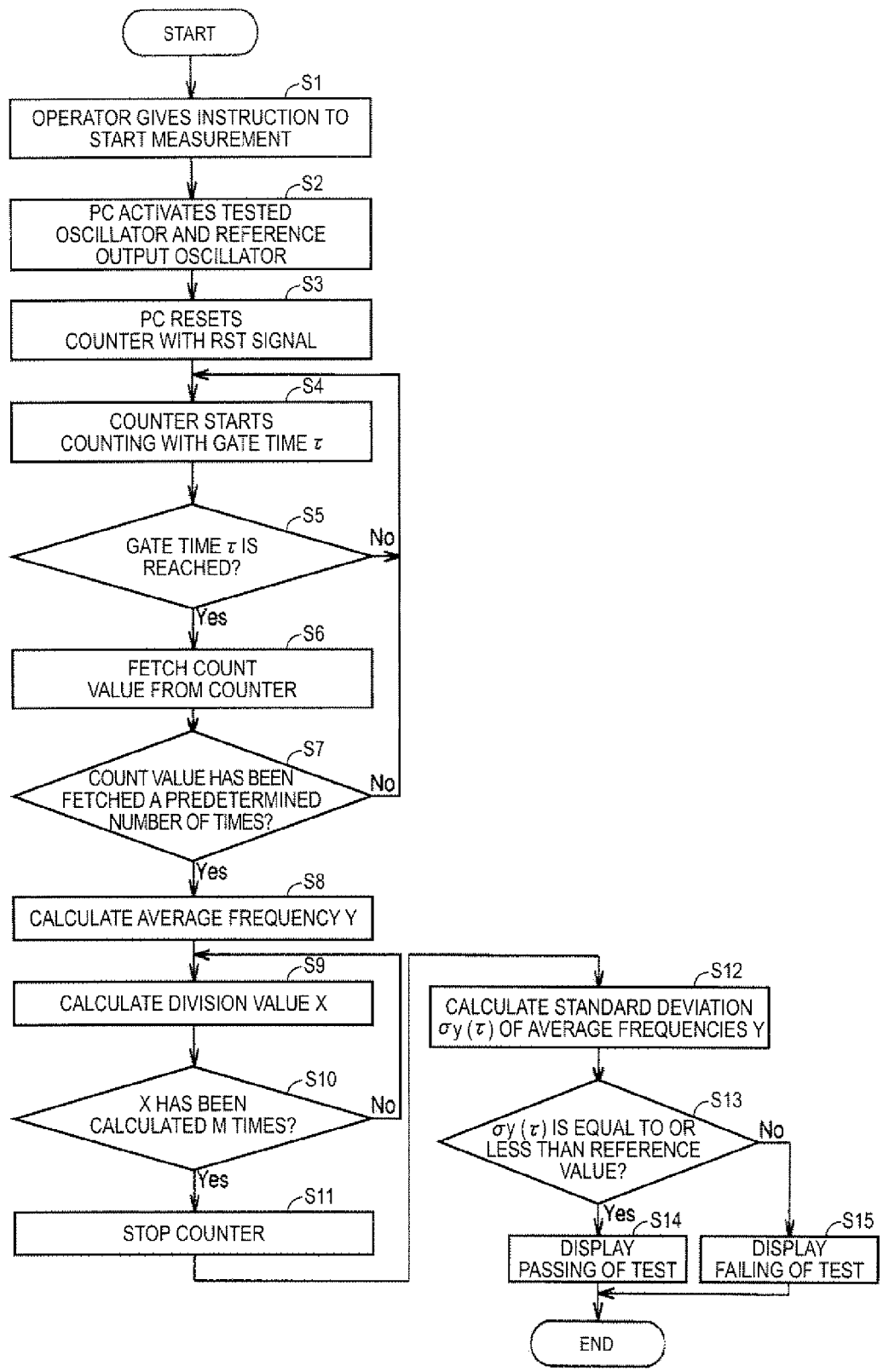
FIG. 3 is a flowchart for explaining an operation of the frequency stability measuring apparatus according to the embodiment of the invention.

FIG. 3 is a flowchart for explaining an operation of the frequency stability measuring apparatus.

First, if an operator instructs the frequency stability measuring apparatus 100 to start measurement (S1), the PC 7 activates the oscillators 1 and 2 with the control signal (START) 9 (S2). Next, the PC 7 resets the counter 6 with the reset signal (RST) 8 (S3) and the counter 6 starts counting with the predetermined average measurement time τ (S4). If the average measurement time τ is reached (YES at S5), the count value is fetched (S6). Then, it is checked whether the count value has been fetched a predetermined number of times (S7), as required for calculating the average value, and if it has been fetched the predetermined number of times (YES at S7), the PC 7 calculates an average frequency Y of the signal SL within each average measurement time τ based on the number of pulses of the signal SL obtained (S8), and stores the average frequency Y in a memory (not shown). The PC 7 also calculates a division value X and stores it in the memory (S9). The division value X is obtained by dividing the square of the difference between the average frequency Y within a current average measurement time τ and the average frequency Y within a previous average measurement time τ by two. Specifically, the division value X is given by $X=(Y_{k+1}-Y_k)^2/2$, where $Y_{k+1}$ is the average frequency within the current average measurement time τ and $Y_k$ is the average frequency within the previous average measurement time τ.

Then, if the division value X has been calculated a predetermined number of times M (YES at S10), the PC 7 stops the fetching of the above-described count value, the calculation of the division value X, and the like (S11), and calculates the standard deviation σy(τ) of the average frequencies Y of the signal SL by calculating the square root of the average of the M division values X stored in the memory (S12). Specifically, the standard deviation σy(τ) is given by the following equation;

$$\sigma_y(\tau) = \sqrt{\sum_{k=1}^{m-1} \frac{X}{m-1}}$$

As such, the PC 7 is capable of calculating the standard deviation σy(τ) of the average frequencies Y of the signal SL quickly after the count value has been fetched from the counter 6 m times, i.e., after a time of the average measurement time τ×m has elapsed after the start of measurement.

Next, the PC 7 determines whether or not the standard deviation σy(τ) calculated is equal to or less than a predetermined reference value (S13), and if it is determined to be equal to or less than the reference value (YES at S13), an indication of the frequency stability satisfying a criterion (i.e., passing the test) is displayed on the display screen (S14). On the other hand, the standard deviation σy(τ) calculated is determined to be greater than the reference value (NO at S13), an indication of the frequency stability not satisfying the criterion (i.e., failing the test), i.e., an indication of the tested-oscillator 1 being defective, is displayed on the display screen (S15). Then, unless an instruction to perform a measurement again is inputted after the determination of any kind is displayed, the PC 7 automatically stops the oscillators 1 and 2 after a predetermined time has elapsed.

Figure 4:
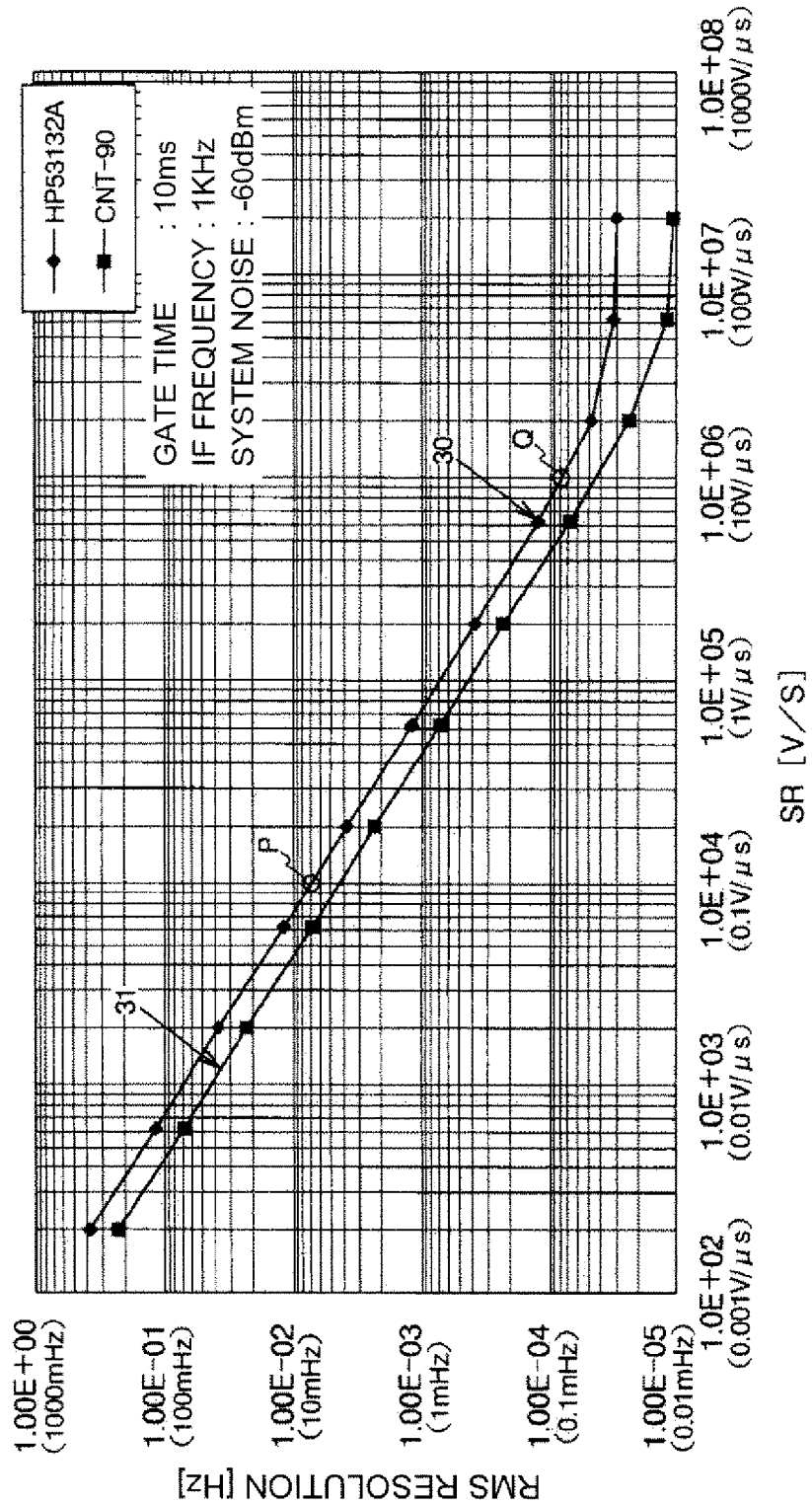
FIG. 4 is a diagram illustrating a relationship between an input signal SR and an RMS resolution.
Figure 5:
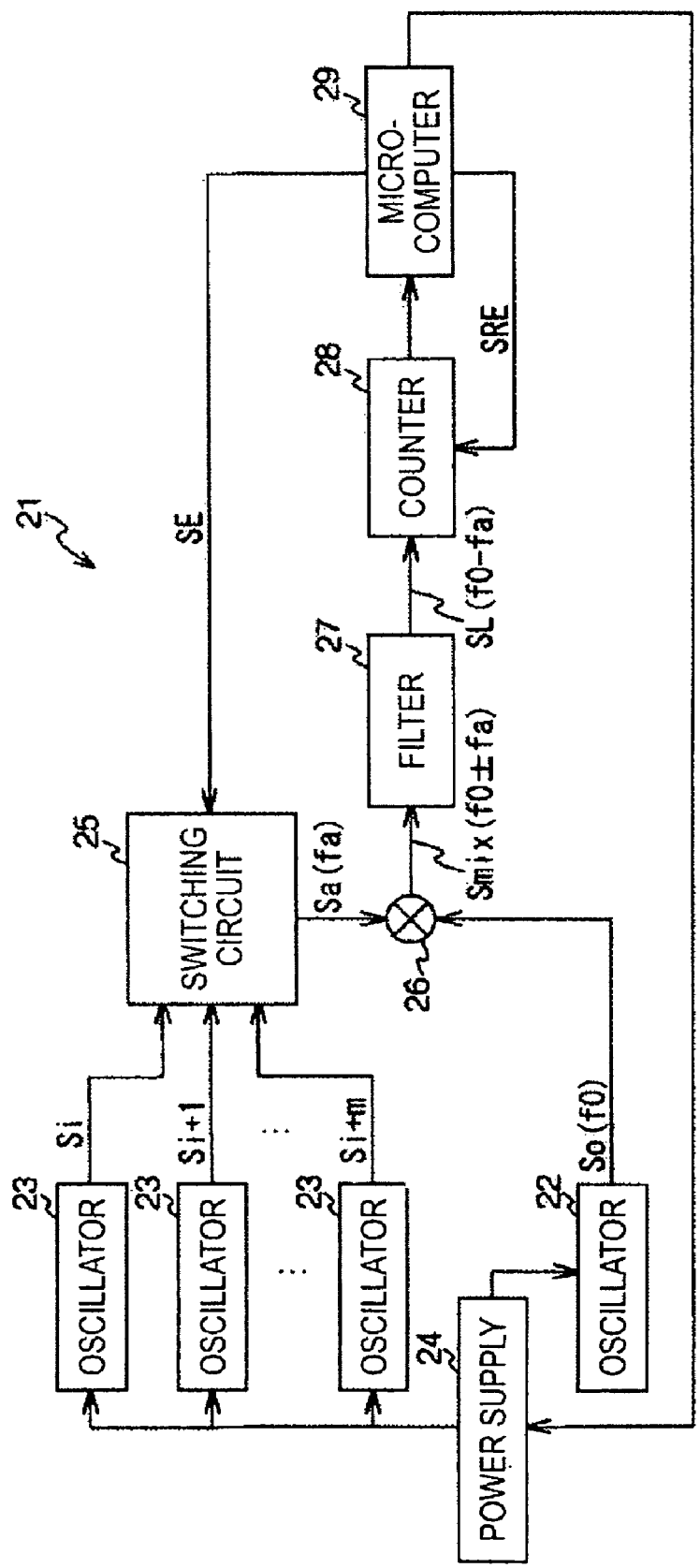
FIG. 5 is a block diagram of a frequency stability testing apparatus as disclosed in the above-described example of related art, which has addressed a problem of known quadrature detection.

FIG. 4 is a diagram illustrating a relationship between an input signal SR and an RMS resolution. The resolution (Hz) is plotted along the vertical axis, and the SR (V/S) is plotted along the horizontal axis. The resolution and the SR are also expressed in units of mHz and V/μs, respectively, along the vertical and horizontal axes. This figure shows characteristics of two models of counters, HP53132A (denoted by reference numeral 30) and CNT-90 (denoted by reference numeral 31). As is apparent from this figure, in order to measure the stability of a crystal oscillator with a sufficient resolution, if a counter gate time is set to approximately 10 ms, a frequency resolution of approximately 0.1 mHz (the SR at point Q in FIG. 4, i.e., 10V/μs) is required, but general counters achieve only a resolution of approximately 10 mHz (the SR at point P in FIG. 4, ice., 0.1V/μs). The resolution exhibits a straight-line change from point P to point Q, but it is seen that the resolution is in saturation beyond point Q. That is, the relationship between the SR of the input signal and the frequency resolution is such that the resolution improves in proportion to the SR. However, the resolution does not improve infinitely but becomes saturated at a certain SR. Thus, even if the SR is made higher, the resolution does not change, and if the SR is made higher inadvertently, only noise and jitter increase. Therefore, setting the SR close to the saturation point of the resolution is the most efficient.

As described above, according to the embodiment of the invention, the frequency resolution is increased by subjecting the waveform shaped by the waveform-shaping circuit 5 to counting, and the average frequencies are calculated based on the number of pulses counted by the counter 6 and the standard deviation of the calculated average frequencies is calculated to determine the passing or failing of a test. Therefore, measurements with a high resolution can be achieved and the measurement time can be shortened.

Further, the slew rate of the signal inputted to the counter in a predetermined gate time is set close to the saturation point of the frequency resolution of the counter 6. Because of this, the setting of an unnecessary slew rate can be avoided, and the setting of an efficient slew rate can be achieved.

Still further, the filter 4 is formed by a low-pass filter or a band-pass filter. Accordingly, an unnecessary harmonic is removed to accomplish the counting of a signal with reduced noise.

Still further, the slew rate of the waveform-shaping circuit 5 is set in the range of 0.1 V/μs to 100 V/μs. Therefore, the slew rate can be selected in accordance with the accuracy of an oscillator.

The entire disclosure of Japanese Patent Application No. 2005-243483, filed Aug. 24, 2005 is expressly incorporated by reference herein.

What is claimed is:

1. A frequency stability measuring apparatus for measuring a frequency fluctuation of a signal outputted from a given signal source, the apparatus comprising:
   a reference signal output unit that outputs a reference frequency signal;
   a mixer that mixes a signal outputted from the signal source with the reference frequency signal outputted from the reference signal output unit and outputs a resultant signal;
   a filter that allows a low-frequency component of the signal outputted from the mixer to pass therethrough;

a waveform-shaping circuit that shapes a waveform of a signal outputted from the filter;

a counter that counts a number of pulses of a signal shaped by the waveform-shaping circuit; and a control unit that calculates average frequencies of the signal outputted from the filter within respective measurement periods of a predetermined length, and calculates and outputs a standard deviation of the average frequencies calculated, wherein the waveform-shaping circuit includes an amplifier that amplifies a waveform of the signal outputted from the filter and an amplitude limiter circuit that limits an amplitude of a signal outputted from the amplifier, wherein a slew rate of the signal inputted to the counter in a predetermined gate time is set close to a saturation point of a frequency resolution of the counter, and wherein the slew rate of the waveform-shaping circuit is set in a range of 0.1 V/µs to 100 V/µs.

2. The frequency stability measuring apparatus according to claim 1, wherein the waveform-shaping circuit comprises:

a first resistance that has an input, which is connected to an output of the filter, and an output;

an operational amplifier that has a non-inverting input, which is connected to the output of the first resistance, and an output that is connected to an input of the counter;

a second resistance that is connected to the non-inverting input and to the output of the operational amplifier;

a first Zener diode that has an input, which is connected to the non-inverting input, and an output; and a second Zener diode that has an input, which is connected to the output of the first Zener diode, and an output that is connected to the output of the operational amplifier and to the input of the counter.

* * * * *